(12) United States Patent
Tzeng

(10) Patent No.: US 6,284,315 B1
(45) Date of Patent: Sep. 4, 2001

(54) METHOD OF POLISHING DIAMOND FILMS

(75) Inventor: Yonhua Tzeng, Auburn, AL (US)

(73) Assignee: Aurburn University, Auburn, AL (US)

( * ) Notice: Subject to any disclaimer, the term of this patent is extended or adjusted under 35 U.S.C. 154(b) by 0 days.

(21) Appl. No.: 09/483,433

(22) Filed: Jan. 14, 2000

Related U.S. Application Data

(63) Continuation-in-part of application No. 08/890,770, filed on Jul. 11, 1997, now abandoned.
(60) Provisional application No. 60/022,397, filed on Jul. 29, 1996.

(51) Int. Cl.[7] .................................................. C23C 16/00
(52) U.S. Cl. ......................... 427/249.1; 51/307; 51/309; 407/119; 427/355; 427/374.1; 427/376.5
(58) Field of Search ................................ 427/249.1, 355, 427/374.1, 376.5; 407/119; 51/307, 309

(56) References Cited

U.S. PATENT DOCUMENTS

| | | | |
|---|---|---|---|
| 4,174,380 | 11/1979 | Strong et al. | 423/446 |
| 5,114,745 | 5/1992 | Jones | 427/113 |
| 5,202,156 | 4/1993 | Yamamoto et al. | 427/135 |
| 5,270,077 | 12/1993 | Knemeyer et al. | 427/249 |
| 5,364,423 | 11/1994 | Bigelow et al. | 51/293 |
| 5,382,274 | 1/1995 | Yamamoto et al. | 65/26 |
| 5,403,619 | 4/1995 | Cuomo et al. | 427/248 |
| 5,451,430 | 9/1995 | Anthony et al. | 427/372.2 |
| 5,468,326 | 11/1995 | Cuomo et al. | 156/345 |
| 5,480,686 | 1/1996 | Rudder et al. | 427/562 |
| 5,523,121 | 6/1996 | Anthony et al. | 427/249 |

OTHER PUBLICATIONS

Jin, S et al., "Massive thinning of diamond films by a diffusion process." Appl. Phys. Lett, 60 (16), Apr. 20, 1992, pp. 1948–1950.*

Tokura, Hitoshi, "Study on the polishing of chemically vapour deposited diamond film." Thin Solid films, 212 (1992) pp. 49–55. (No month available).*

*High Performance Polishing Techniques for DVD Diamond*; Final Report (Phase I) Submitted to Naval Air Warfare Center Under Contract No. N68936–93–C–0246, Y. Tommy Tzeng—Principal Investigator, Auburn University (No date available).

*Rapid Polishing of Thick Polycrystalline "White" CVD Diamond by Liquid Metal Films*, Article, Department of Electrical Engineering, Auburn University, Y. Tzen, J. Wei, c. Cutshaw, and T. Chein (No date available).

Microwave CVD of Diamond Using Methanol–Rare Gas Mixtures, M. Buck, T.J. Chung, J.H. Kaufman and H. Seki, Materials Research Society Symposium Proceedings, vol. 162, p. 97–101, (1990) (No month available).

*Polishing of CVD Diamond Film*, Article Elsevier Science Publishers B.V., 1991, Hitoshi Tokura and Masanori Yoshikawa, Faculty of Engineering, Tokyo Institute of Technology (No date availble).

* cited by examiner

*Primary Examiner*—Bernard Pianalto
(74) *Attorney, Agent, or Firm*—Womble Carlyle Sandridge & Rice, PLLC

(57) ABSTRACT

An improved process for smoothing the surface of a diamond or diamond film comprises placing the surface of the diamond against the surface of a metal plate and heating the diamond and the plate to a temperature greater than the melting point of metal carbide and less than the melting point of the metal itself. The carbon atoms in the diamond diffuse or dissolve through solid state diffusion into the metal to form metal carbide. The metal carbide melts and around the points of contact between the diamond and the metal surface, which accelerates the diffusion or dissolution of the diamond and thereby accelerates the smoothing of the diamond surface. When the surface of the diamond is smoothed, it is cooled, removed from the plate, and cleaned of residual metal carbide.

23 Claims, 4 Drawing Sheets

METHOD OF POLISHING DIAMOND FILMS

REFERENCE TO RELATED APPLICATION

This application is a Continuation-in-Part of copending U.S. patent application Ser. No. 08/890,770, filed Jul. 11, 1997, abandoned and which claims the benefit of U.S. Provisional Patent Application Ser. No. 60/022,397 filed Jul. 29, 1996.

FIELD OF THE INVENTION

The present invention relates in general to the polishing of diamonds. In particular, the present invention relates to a method of polishing diamonds and/or diamond films by exploiting the reactivity between the peaks of carbon diamond grains on the rough surface of a diamond and the metal of a metal plate at high temperatures.

BACKGROUND OF THE INVENTION

Diamonds are one of the hardest substances known and they possess a number of desirable physical properties including hardness, chemical inertness, high thermal conductivity, and high electrical resistivity. Consequently, diamonds have become important for use in a variety of emerging technological devices, including semiconductors, heat sinks, abrasives, drill bits for use in drilling and in rock quarrying, and optical devices and lasers. Given the scarcity and expense of natural diamonds for such uses, there has been considerable interest in the development of synthetic diamonds. One process for producing synthetic diamonds and particularly diamond films is known as chemical vapor deposition (CVD). In the past several years, a variety of chemical vapor deposition techniques have been developed for producing high quality diamond films for use in optical devices, semi-conductors, and the like. For example, U.S. Pat. Nos. 5,114,745, of Jones, 5,270,077 of Knemeyer et al., and 5,523,121 of Anthony et al. disclose methods and techniques for producing diamond films.

One of the main problems associated with the production of diamonds and diamond films has been the control of the growth rate of the diamond material and control of roughness of the surface of the diamond. Many uses for diamond films require that the surfaces of these films be polished and substantially smooth, especially for heat management applications and for optical and tribological uses. Consequently, various methods have been developed for polishing the initially relatively rough surface of diamond films. Some of these methods primarily have focused on the use of various metals such as iron or nickel under conditions of high heat and pressure. For example, one of the principle techniques has been to apply molten iron or another liquid ferrous metal directly to the rough surface of a diamond film. Upon contact, the liquid iron molds itself to the contours, i.e., the peaks and troughs, of the rough surface of the diamond and the carbon in the diamond film diffuses into the iron to form iron carbide. Prolonged exposure to the molten iron causes the surface of the diamond film to diffuse away to a smooth or substantially smooth condition as the carbon on its surface is slowly converted to iron carbide. The problem with such a method is that it tends to dissolve away a significant amount of the diamond from both the peaks and valleys of the rough diamond surface, thus wasting a significant amount of diamond material.

This, in turn, leads to greater expense, and further requires significant time. In addition, it is very difficult to achieve a diamond surface with other than a flat configuration with this process.

Other smoothing techniques or methods include polishing the diamond film with a rotating metal polishing plate, typically formed from iron, nickel, and/or molybdenum, and at high temperatures and pressures. The polishing operation usually is carried out in a vacuum or within an inert atmosphere of hydrogen, nitrogen, helium, and/or argon gas in the polishing chamber. (See Tokura, Yoshikawa, Polishing of CVD Diamond Film; Applications of Diamond Films and Related Materials (1991).)

U.S. Pat. Nos. 5,403,619 and 5,468,326 of Cuomo et al illustrate a method of polishing a diamond film using an ionic conductor and the application of oxygen. Oxygen anions are produced by formation of vacancies in the superionic conductor and react with the diamond or carbon nitride of the diamond film to erode and thus smooth the peaks of the diamond film.

The problem with the latter two polishing methods generally has been the time and expense required to accomplish the polishing of the CVD and other synthetic diamond films. Both processes are carried out at relatively low rates on the order of 1 micrometer per hour for the Yoshikawa process and approximately 0.19 micrometers per half hour for the process of Cuomo et al. Thus, for diamonds with high surface roughnesses, i.e. 30–200 micrometers peak to valley, these processes can take up to several days to smooth and polish a diamond surface. These processes further require specialized polishing chambers and equipment that increase their cost. In addition, such methods are limited in that the difficulty of controlling the process tends to limit the number of diamond films that can be polished during each polishing operation.

In attempts to minimize the drawbacks of conventional polishing techniques, it has become possible through the development of improved chemical vapor deposition production techniques to create thicker diamonds and diamond films of higher optical and thermal quality and an initially smoother surface. Obviously, the cost of polishing a rough diamond decreases significantly as the initial smoothness of the surface of the diamond increases because less material must be removed to flatten the surface of the diamond to the desired smoothness. This is particularly beneficial for diamonds that are to be formed with non-planar surfaces that must be highly polished to a mirror-like smoothness. Accordingly, greater emphasis has been placed on the production of diamonds with initially smoother surfaces to reduce or even eliminate the need to polish the surfaces. For example, U.S. Pat. Nos. 5,114,745, 5,270,077 and 5,523,121 all relate to the formation of diamonds that are grown with substantially smooth surfaces to eliminate the need for polishing. The problems with such methods typically relate to the costs and time required for production of such diamonds and the consequent limits on production rates. In addition, it is difficult to produce diamonds with nonplanar surfaces, especially with nonplanar surfaces that are highly polished to mirror-like smoothness. Thus, the production of diamonds with surfaces that do not need polishing has not proven to be a complete solution.

Accordingly, it can be seen that a need exists for a method of polishing and smoothing diamonds rapidly, safely, with inexpensive materials and equipment, and without the requirement of increased ambient pressures. The process should be usable to polish large area planar or nonplanar diamond surfaces and be capable of polishing multiple diamonds or diamond films at the same time to increase production rate. It is to the provision of such a method that the present invention is primarily directed.

SUMMARY OF THE INVENTION

Briefly described, the present invention relates in general to a rapid and relatively inexpensive method of polishing or smoothing rough surfaces of chemical vapor deposition (CVD) diamonds and/or diamond films, and other synthetic diamonds, sintered diamond compacts and natural diamonds at a high rate without a significant loss or waste of the diamond material. In a preferred methodology, the diamonds are placed with their rough, peaked surfaces, i.e. the growing surfaces of the diamonds, facing downwardly on a flat smooth metal surface, which may comprise the surface of a metal plate formed from iron or carbon steel or the surface of a metal foil supported by a molybdenum disk. The peaks of the rough diamond surfaces form points of contact between the diamond material and the surface of the metal plate. However, the troughs or valleys of the rough surface do not initially contact the plate since the metal is not molten as in prior art techniques.

The metal plate with the diamonds thereon is placed in a furnace in a hydrogen or other substantially inert environment, and is heated to between approximately 1150° C. to 1250° C. At these temperatures, which are below the melting point of the metal that forms the plate, i.e. iron, the metal surface of the plate remains solid. However, at the points of contact between the peaks of the rough diamond surface and the metal plate, carbon atoms from the diamond react with iron atoms from the plate to form metal carbide through the process of solid state diffusion. Since the metal carbide has a melting point lower than the 1150° C. temperature of the furnace, the metal carbide melts and a small amount of molten liquid metal carbide puddles or forms a thin layer at or around each point of contact.

The presence of the liquid metal carbide greatly accelerates the dissolution of carbon atoms from the peaks of the diamond surface into the liquid metal carbide on the metal plate. Carbon in the liquid metal carbide reacts with the solid metal resulting in further melting of the surface layer of the metal plate. The additional metal content in the liquid metal carbide in turn further reacts with the carbon atoms of the diamond surface for the increased formation of liquid metal carbide and the removal of carbon from the diamond. As the dissolution progresses at the points of contact, the high points on the rough surface of the diamond gradually dissolve into the liquid metal carbide. Eventually, all of the high points on the diamond's surface are dissolved or diffused down to the level of the valleys. As a result, the rough surface of the diamond is smoothed to within a variance of approximately 2–4 um. Further, because of the accelerated dissolution of carbon due to the liquid metal carbide, the entire polishing process of this invention can be carried in less than five minutes, with only a minimal amount of diamond from the diamond film being removed to achieve the desired smooth surface. The result is a highly polished diamond surface in a short time with a minimum of sophisticated expensive equipment.

The present invention further can be adapted to the formation of diamonds or diamond films having a curved or otherwise shaped/configured surfaces with three dimensional micro and/or macro structures. The diamond is placed on a metal, i.e. iron, plate machined or etched with a curved surface or a surface with etched trenches and/or recesses, or other topography. In the early phase of the process, only a portion of the diamond touches, which gradually increases as the portions of the diamond in contact with the metal are dissolved into liquid metal carbide, so that the diamond changes shape as it dissolves to form or take on the reverse topography of the metal surface to form the desired curvature or configuration.

Various objects, features and advantages of the present invention will become apparent to those skilled in the art upon review of the following specification, taken in conjunction with the accompanying drawings.

DETAILED DESCRIPTION

Figure 1:
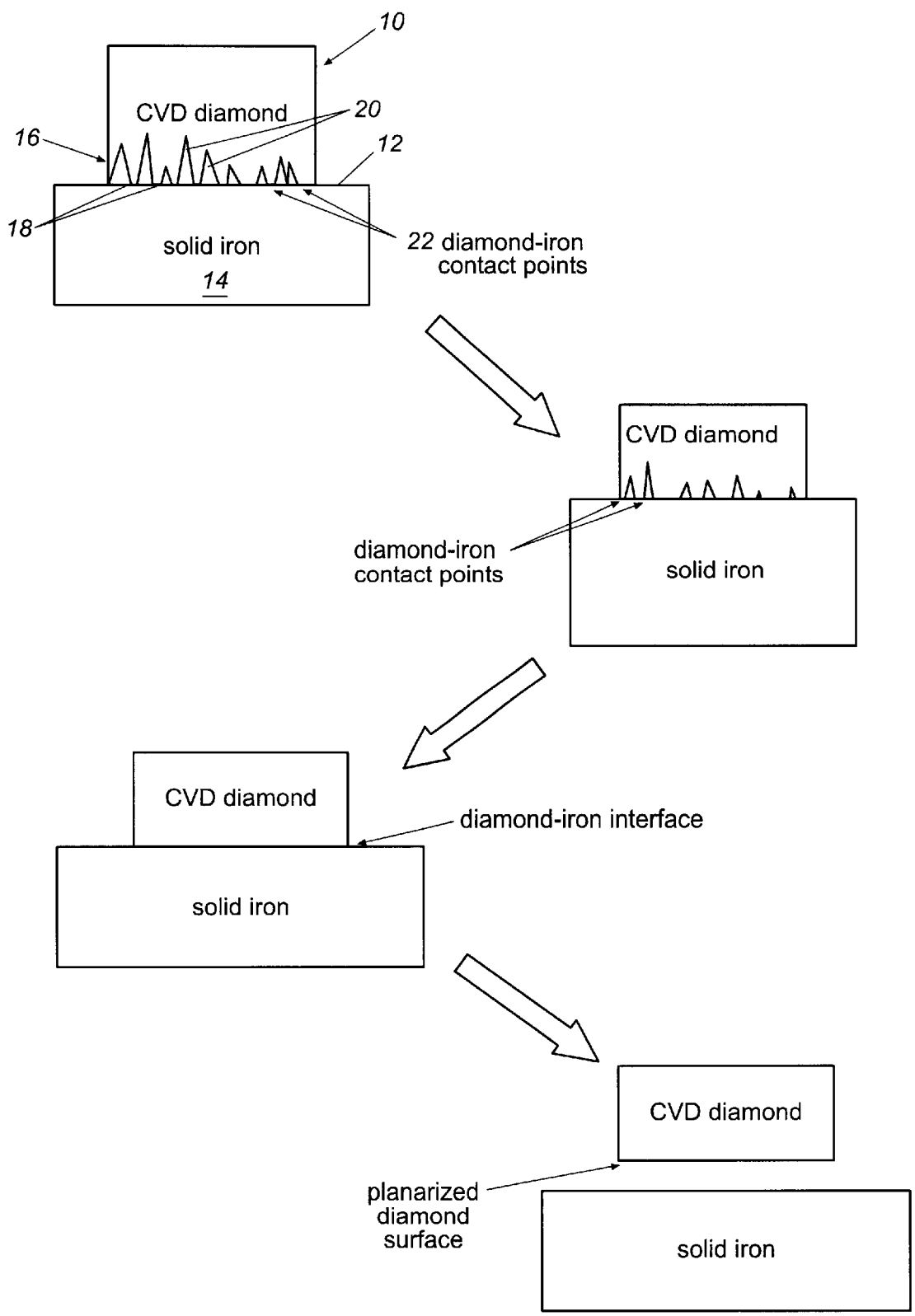
FIG. 1 is a schematic illustration of the process for polishing a diamond that embodies principles of the present invention.

Referring now in greater detail to the drawings, in which like numerals indicate like parts throughout the several views, FIG. 1 illustrates schematically a preferred method of carrying out the process of the present invention for polishing diamonds and/or diamond films such as chemical vapor deposition (CVD) diamonds, synthetic diamonds produced by methods such as high-pressure and high-temperature pressing, sintered diamond compacts and natural diamonds. The surface 16 of a diamond 10, such as a CVD diamond, is illustrated as being rough or unpolished with peaks 18 and valleys 20. The goal, of course, is to remove the peaks substantially down to the level of the valleys and thereby to produce a smooth polished surface. This is accomplished through the process of this invention by placing the diamond 10 upon the substantially smooth, polished upper surface 12 of an iron plate 14. While iron is the metal of choice in the embodiment of FIG. 1, it will be understood that other metals that are reactive with the carbon of the diamond grains to form metal carbides with melting temperatures lower than the melting temperature of the corresponding pure metal also can be used instead of iron. For example, the metal of the plate could be a carbon steel, and/or instead of a plate, a metal foil supported by a molybdenum disk could be used. Further, the upper surface of the plate can be formed either flat or having a prescribed degree of curvature for imparting to the diamond surface a desired curvature as the diamond surface is polished.

As illustrated in FIG. 1, the diamond generally has a rough first surface 16 formed with a series of peaks 18 and valleys 20 that give the rough surface a pitted, or jagged appearance. The diamond generally is placed with its rough surface 16 facing downwardly and resting upon or against the smooth polished upper surface 12 of the iron plate 14. The diamond also can be held by a separate holding mechanism such as a clamp or vacuum chuck, or even a robot arm, which can orient and hold the diamond at a desired angle with respect to the metal surface to achieve a desired angle of shaping and/or polishing. It additionally is possible to place the plate on top of the rough surface as desired, with the weight of the iron plate providing additional pressure upon the contact points, provided that the weight of the iron plate is not so high that the liquid iron carbide film is squeezed from the points of contact toward undesired areas of the diamond surface, i.e. into the valleys, to prevent excess, undesired dissolution of the diamond surface.

The peaks 18 of the rough surface 16 of the diamond 10 engage the upper surface 12 of the iron plate 14 to form diamond-iron contact points 22. Contact between the diamond and the upper surface of the iron plate thus is initially limited to the diamond-iron contact points 22 with the valleys 20 of the rough surface 16 of the diamond at least initially being maintained out of contact with the upper surface of the iron plate. With the diamond thus positioned on the iron plate, the diamond and iron plate, typically together with a number of other diamonds and/or plates, are placed in a furnace or oven (not shown) in a hydrogen or other substantially inert environment. The furnace is then heated above an eutectic temperature within a range of between approximately 1100° C. to 1300° C. and typically between approximately 1150° C. to 1250° C.

Figure 2:
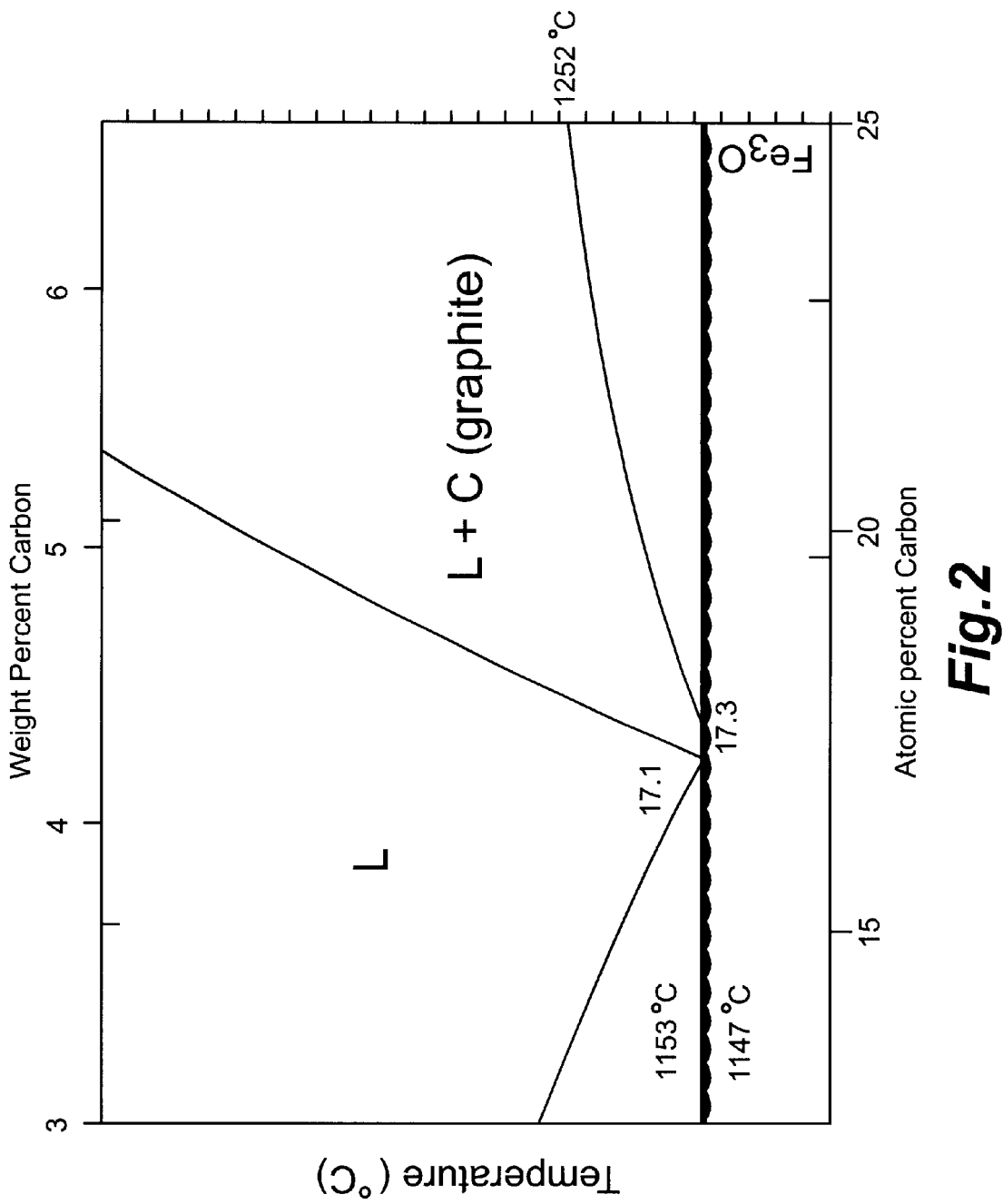
FIG. 2 is a graphical illustration of a phase diagram for carbon and iron.
Figure 3A:
FIGS. 3A, 3B, 3C and 3D are optical micrographs showing the surfaces of a diamond before, during, and after polishing, using the process of the present invention.
Figure 3B:
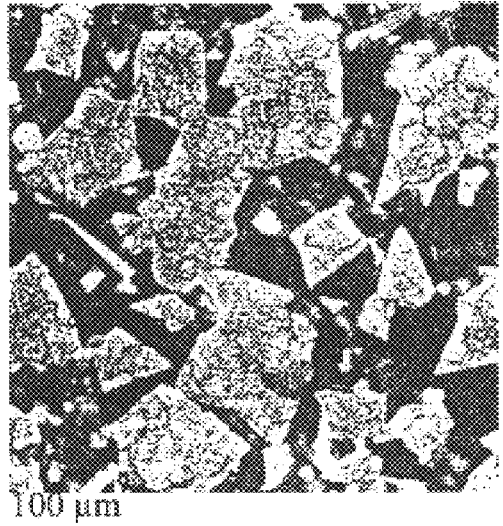
Figure 3C:
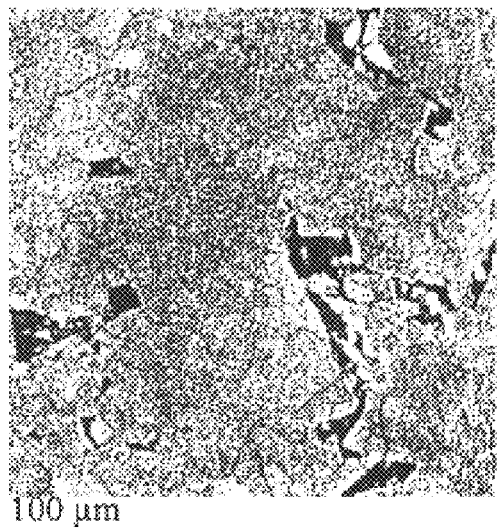
Figure 3D:
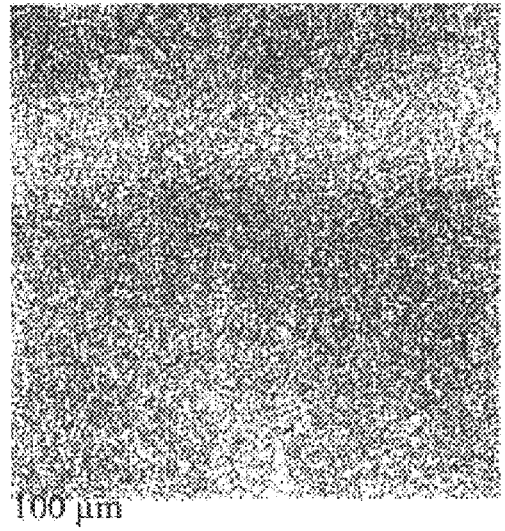

Iron atoms and carbon atoms are reactive in that carbon tends to dissolve or diffuse into iron to form iron carbide at the points of contact during heating of the iron and diamond from room temperature to polishing temperature. This process is accelerated at higher temperatures. Thus, at the points of contact between the peaks of the diamond surface and the iron plate, a liquid iron carbide film initially begins to form in situ as a result of solid state diffusion of the carbon atoms into the metal of the plate. As indicated in the iron-carbon phase diagram shown in FIG. 2, iron carbide typically melts and becomes liquid at temperatures above approximately 1150° C. However, this is a temperature that is below the melting point of iron and other metals. As a result, when the diamonds are heated in the furnace to above approximately 1150° C., the liquid iron carbide film that is initially formed by solid state diffusion at the points of contact 22 melts to form a thin layer of liquid iron carbide, which serves as an interfacial layer between the remaining diamond peaks and the solid metal surface at and around the diamond-iron contact points. The upper surface of the iron plate remains solid because the processing temperature, at which the iron carbide melts, is much lower than the melting point of the iron from which the plate is made.

The presence of liquid iron carbide at the points of contact 22 has been found to increase dramatically the natural solid state diffusion or dissolution of carbon atoms from the diamond into the iron carbide on the plate. The liquid iron carbide, in essence, acts as a sink for the dissolution of carbon from the peaks of the rough diamond surface while the underlying plate supplies iron to form more liquid iron carbide for the remaining diamond peaks. As the dissolution progresses and the peaks of the rough diamond surface gradually dissolve and/or diffuse away, more iron carbide is formed. These increasing quantities of iron carbide generally melt as well to provide more liquid iron carbide to accommodate the progressively broadening points of contact. Through this process, the peaks 18 of the diamond surface are progressively and selectively eroded away at a relatively high rate toward the valleys 20 of the diamond surface, without the valleys themselves similarly being substantially dissolved.

As the diamond peaks diffuse and dissolve away, the flat area at the top of each diamond peak, as well as the area of liquid iron carbide formed around the peaks, increases. Thus, smaller diamond peaks that initially do not touch the upper surface of the plate at the beginning of the process are progressively brought into contact with the surface as the diamond peaks are dissolved away. Thereafter, as indicated in FIG. 1, once the deepest diamond valley 20 has been brought into contact with the upper surface of the iron plate, the diamond-iron contact points 20 will have been substantially diffused and dissolved away such that the area of contact between the diamond and the upper surface of the plate becomes a substantially continuous interfacial layer of diamond, liquid iron carbide and iron. At this point, the rough surface 16 of the diamond 10 will have been substantially smoothed and will have taken on the curvature or shape of the upper surface of the iron plate.

Residual iron carbide on the polished surface of the diamond thereafter can be removed with appropriate chemical enchants, solvents and/or abrasives since it is much softer than the diamond itself. Any minimal residual surface roughness can also be removed using conventional polishing techniques to provide the diamond surface with a highly polished mirror-like surface as required. It has been found that the diamond separates easily from the upper surface of the iron plate upon cooling approximately to room temperature.

During the entire process, although the liquid iron carbide formed at the upper surface of the metal plate initially is only locally distributed and proceeds to a substantially continuous liquid iron carbide film across the diamond-iron interface, the iron plate itself remains solid and generally provides a reference plane that determines the final shape and smoothness of the diamond surface. As a result, the present invention further advantageously enables the shaping of the diamond surface to a predetermined nonplanar shape or curvature or the formation of a diamond surface with three dimensional micro-and macro structures.

In such an application of the present invention, the upper surface of the plate is machined or etched by conventional methods to form a metal surface with a desired curvature or configuration that matches the desired nonplanar shape for the diamond surface, such as being formed with trenches or holes, instead of having to machine or etch the diamond itself, which is much more difficult than machining the metal plate. When the diamond is placed on the surface of the metal plate and heated to 1100° C.–1300° C., as discussed above, the portions of the diamond in contact with the plate are selectively and preferentially dissolved or diffused into liquid metal carbide formed at or around the points of contact. Since the metal plate is not flat, only a limited portion of the diamond is in contact with the metal plate and is dissolved initially in the early phases of the process. As the process continues, the diamond surface is progressively dissolved, increasing the areas or portions of contact between the plate and diamond surface. As a result, the shape of the diamond is progressively changed such that as the diamond reaches the lowest point of the non-planar metal surface, the surface of the diamond is re-formed to or takes on the reverse topography of the metal surface. Also, if there are holes or trenches in the metal plate, the diamond will correspondingly be shaped or reformed having rods or raised projections substantially match the diameter and/or configuration of the hole(s). Thus, using the surface of the plate as a reference, the process of the present invention ensures that the desired shape or configuration of the final diamond surface will substantially match the shape of the surface of the plate, avoiding the need to machine or etch the diamond itself to achieve this shape/configuration.

In addition, in applications where the diamond is mounted in a holding mechanism such as a clamp, vacuum chuck or a robot arm, which holds the diamond against the surface of the metal plate, the holding mechanism can position or orient the diamond at a devised angle with respect to the metal surface to shape the diamond as desired. The holding mechanism further can be used to control the application of the diamond surface against the surface of the metal plate to limit or control the distance that the diamond is permitted to move toward the metal plate to control the amount of the diamond surface that is dissolved. For example, if the highest diamond peak is 50 micrometers, the movement of the diamond toward the metal can be limited to 50 micrometers. The holding mechanism thus can be used to control the motion as well as the angle of contact of the diamond against the metal without necessitating the application of substantial additional pressure to the diamond against the metal.

The process of the present invention is advantageous in that it does not require the exertion of significant additional pressure or force other than the simple force of gravity on the diamond as it rests upon the metal plate in order to polish the rough surface of the diamond. Thus, pressure applying systems or mechanisms such as mechanical presses or similar devices are not required with the present invention. It is also possible to position the metal plate on top of the rough diamond surface to be polished. However, in such an arrangement, precautions must be taken to insure that the pressure applied to the liquid iron carbide layer formed between the diamond and metal surfaces is not so heavy as to cause the liquid iron carbide layer to flow into undesired areas of the diamond surface, such as the valleys thereof, which would tend to cause these undesired areas of the diamond surface also to be further dissolved or diffuse away, creating waste and increasing the time and amount of diamond surface that must be dissolved to smooth the diamond surface to a desired level.

Most significantly, the entire polishing process can be conducted at a rate of up to approximately 30 micrometers of material diffused away in approximately 5 minutes depending upon the processing temperature used. Thus, the process can be controlled to achieve a desired polishing rate or for a desired time by varying the processing temperature. Alternatively, the process can be controlled by means other than time, such as, for example, by using a metal plate or foil with a pre-selected thickness so that the maximum amount of carbon that can be removed will be determined by the thickness of the foil and the solubility of the carbon in the metal at the processing temperature. The present invention therefore provides a rapid polishing technique for smoothing rough diamonds or diamond films compared to prior art techniques. Further, the method of this invention employs inexpensive, safe, and relatively low reactive materials, such as iron and stainless or carbon steel, to react with the diamond surface. Unlike conventional polishing processes, no moving parts, such as a polishing wheel or similar abrasive device, are required, and no further significant pressure needs to be applied to the diamond significantly in excess of the weight of the diamond itself.

In addition, since the process does not require highly specialized equipment, other than a conventional furnace, the process can be utilized to smooth large area or nonplanar diamond surfaces, and can also be used to smooth multiple diamonds or diamond films at the same time. Finally, since only the material necessary to achieve smoothness is removed from the diamond surface, there is no waste of diamond and this conserves material, eliminating the requirement of thicker films to accommodate excess abrasion.

Process Test Results

In tests conducted using the process of the present invention, a 600 um thick diamond was polished at approximately 1250° C. The smoothing process took approximately twenty minutes, leaving a final surface roughness of the diamond film, as planarized, of approximately 2–4 um. FIGS. 3A–3D illustrate the surface of the diamond before, during, and after the polishing. As shown in these optical micrographs, the diamond started the process with an extremely rough surface and was polished to a substantially flat surface. In addition, the high quality of the diamond for use in optical devices, etc. is preserved throughout the polishing process.

Figure 4:
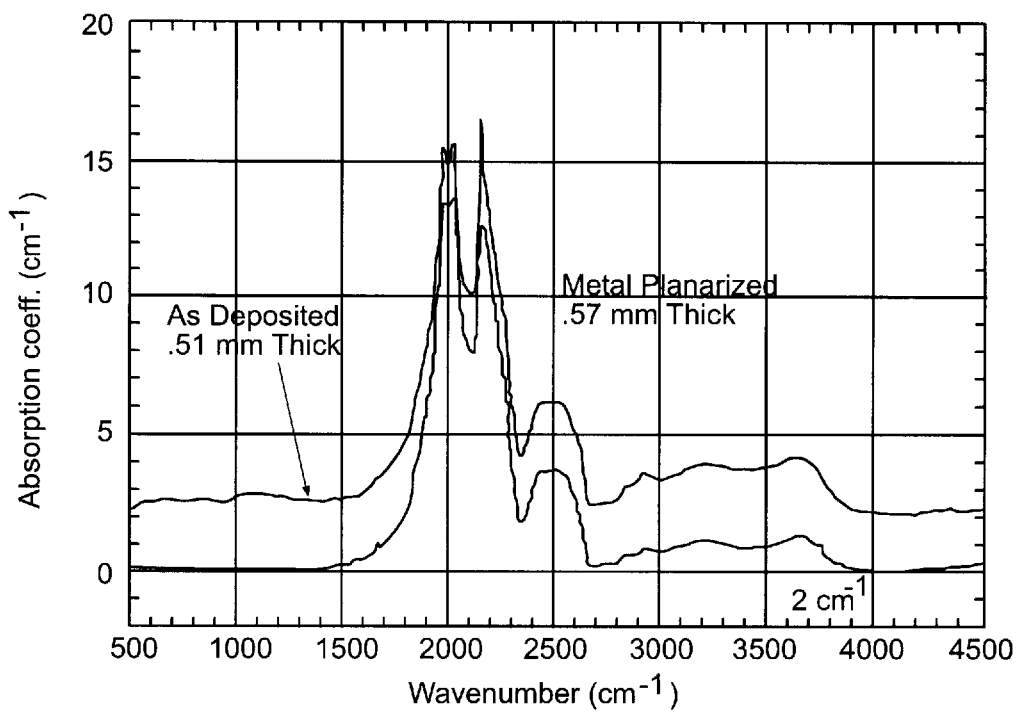
FIG. 4 is a graphical illustration of the FTIR optical absorption spectra for a diamond before and after being polished using the process of the present invention.
Figure 5:
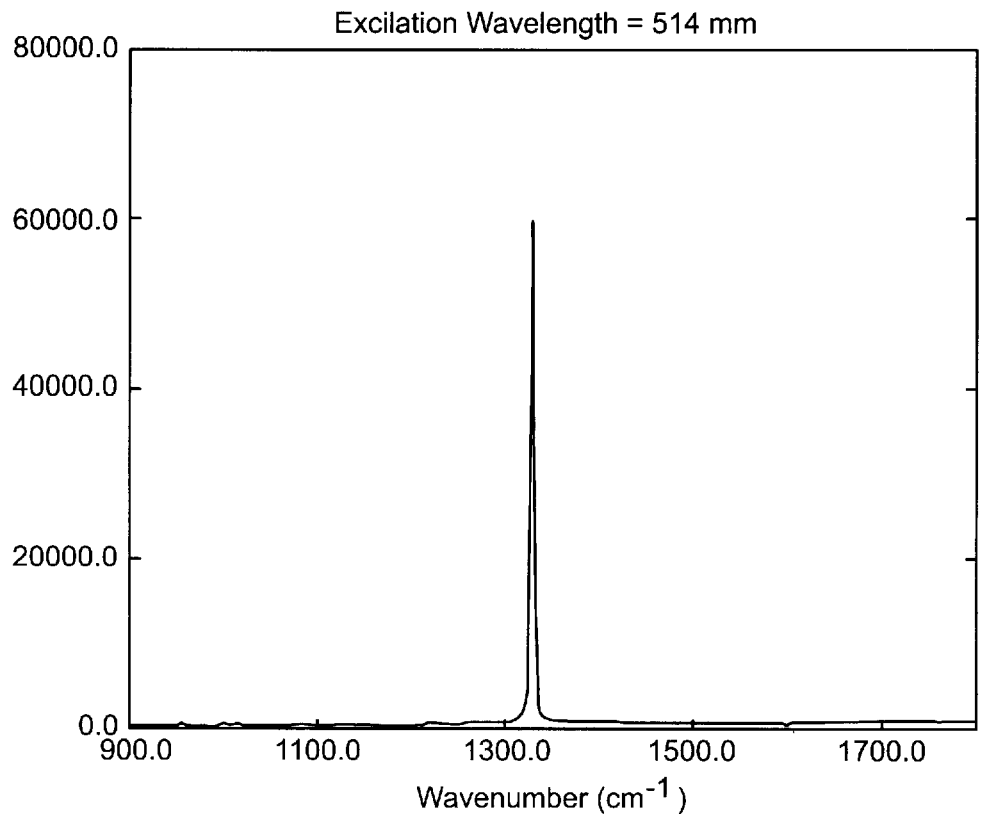
FIG. 5 is a graphical illustration of Raman spectrum of a diamond polished using the process of the present invention.

FIG. 4 illustrates the FTIR optical absorption spectra, comparing the infrared absorption of the diamond before being polished and after being polished or planarized. As shown, the absorption spectra for the diamond both before and after being polished are practically identical. Therefore, the infrared absorption characteristics of the diamond are not degraded after having been polished by the process of the present invention. In addition, the Raman Spectrum of the polished diamond, as shown in FIG. 5, indicates that the diamond surface of the polished diamond remains of high quality after polishing.

The formation of liquid iron carbide at the points of contact between the diamond on the iron plate in the process of this invention dramatically accelerates the dissolution or diffusion of carbon atoms from the diamond into the liquid iron carbide layer formed on the iron plate and, as a result, provides a rapid, efficient method of smoothing and polishing thick and rough surface diamonds without significant waste of material. The reaction is isotropic and can be tailored to form smooth diamond surfaces that are either planar or non-planar to prevent graphitization of the diamond during the high temperature process. In addition, although the process of the present invention has been disclosed as typically using iron for the metal plate, other metals that form carbides having different melting points than iron carbide can be used. Consequently using metals forming carbides with lower melting points may allow lower processing temperatures.

It therefore will be understood by those skilled in the art that while the present invention has been described with reference to the preferred methodology disclosed above, various changes, modifications, and additions can be made thereto without departing from the spirit and scope of the invention as set forth in the following claims.

What is claimed is:

1. A method of polishing a surface of a diamond, comprising the steps of:

placing the surface of the diamond on a surface of a metal selected from the group consisting of iron and steel, with peaks in the surface of the diamond forming points of contact between the diamond and metal surface;

heating the metal surface to a predetermined temperature above a melting temperature of a metal carbide formed by diffusion of carbon from the diamond to the metal surface at the points of contact and below the melting temperature of the metal surface to form a liquid metal carbide film at the points of contact between the diamond surface and the metal surface; and maintaining the surface of the diamond in contact with the liquid metal carbide film formed between the diamond surface and the heated metal surface for a predetermined time sufficient for selected peaks to be eroded away through diffusion of the diamond with the liquid metal carbide film at the points of contact to form a smooth polished surface on the diamond without applying substantial additional pressure to the diamond against the metal sufficient to cause the liquid metal carbide film at the points of contact to be urged away from the points of contact.

2. The method of claim 1 and wherein the metal surface comprises iron.

3. The method of claim 1 and further including the steps of cooling the smoothed diamond and the metal surface and separating the smoothed diamond from the metal surface.

4. The method of claim 1 and wherein the step of heating the metal surface comprises heating the metal surface to a temperature within the range of approximately 1150° C. to 1250° C.

5. The method of claim 1 and wherein the step of placing the surface of the diamond on a metal surface comprises orienting the rough surface of the diamond downwardly and placing the diamond on top of the metal surface with the peaks of the diamond surface facing downwardly and in contact with the metal surface.

6. The method of claim 1 and wherein the step of placing the surface of the diamond on a metal surface includes mounting the diamond in a holding mechanism and applying the diamond against the metal surface at a desired angle with respect to the metal surface.

7. The method of claim 6 and wherein the diamond is formed by chemical vapor deposition (CVD).

8. A method of smoothing a surface of a diamond comprising the steps of;
   (a) placing the surface of the diamond in contact with a polished metal surface having a smoothness corresponding to the desired smoothness of the diamond surface, and heating the diamond and metal surface to form liquid metal carbide through diffusion of carbon atoms between the diamond and the metal surface at points of contact between the diamond and the metal surface;
   (b) heating the metal surface to a temperature greater than the melting point of the metal carbide to continue forming liquid metal carbide at the points of contact between the diamond and the metal surface, the liquid metal carbide for accelerating the diffusion of carbon atoms from the diamond into the metal surface at the points of contact; and
   (c) maintaining the surface of the diamond in contact with the liquid metal carbide formed between the surface of the diamond and the metal surface without requiring application of substantial additional pressure to the diamond sufficient to cause the liquid metal carbide to be urged away from the points of contact between the diamond and the metal surface, and dissolving peaks formed in the diamond surface, which form the points of contact with the liquid metal carbide, until the surface of the diamond is smoothed to a desired smoothness.

9. The method of claim 8 and wherein step (c) comprises orienting the metal surface in an upwardly facing configuration and placing the diamond on the metal surface, the weight of the diamond providing sufficient force to maintain the surface of the diamond in contact with the metal surface.

10. The method of claim 8 and wherein step (b) comprises placing the metal surface and the diamond in a furnace.

11. The method of claim 8 and where in step (b) the metal surface is heated to a temperature less than the melting point of the metal surface.

12. The method of claim 8 and wherein a plurality of diamond surfaces are placed at the same time on the metal surface for simultaneous smoothing.

13. The method of claim 8 and wherein step (a) includes the step of placing the surface of the diamond on a metal surface includes mounting the diamond in a holding mechanism and applying the diamond against the metal surface at a desired angle with respect to the metal surface.

14. The method of claim 8 and wherein step (c) comprises controlling movement of the surface of the diamond toward the metal surface as the peaks of the diamond surface are dissolved.

15. The method of claim 8 and wherein the metal surface is made of iron.

16. The method of claim 8 and wherein the metal surface is made of carbon steel.

17. In a process of smoothing the surface of a diamond wherein the diamond surface is placed in contact with a metal surface and wherein the diamond surface is smoothed through the diffusion of carbon atoms from the diamond surface into which liquid metal carbide is formed at points of contact between the diamond surface and the metal surface, the improvement comprising:
   (a) heating the metal surface to a temperature greater than the melting point of the metal carbide to form the liquid metal carbide at points of contact between the diamond surface and the metal surface;
   (b) maintaining the diamond surface in contact with the metal surface without application of substantial additional pressures sufficient to urge the liquid metal carbide away from the points of contact; and
   (c) progressively and selectively dissolving the carbon atoms into the liquid metal carbide at the points of contact to smooth the diamond surface to a desired amount with minimal dissolution of the diamond surface.

18. The method of claim 17 and wherein the metal surface is heated to a temperature greater than the melting point of the metal carbide and less than the melting point of the metal surface.

19. The method of claim 17 and wherein the metal surface is made of iron.

20. A method of forming a diamond surface having a desired configuration, comprising:
   (a) placing a diamond on a metal surface having a topography to match the desired configuration of the diamond surface with portions of the surface of the diamond to be treated engaging the metal surface to form points of contact between the diamond and metal surfaces;
   (b) heating the metal surface to a temperature below a melting temperature of the metal surface to form a liquid metal carbide layer as carbon atoms from the diamond surface diffuse into the metal surface at the points of contact between the metal surface and diamond surface;
   (c) maintaining the surface of the diamond in contact with the liquid metal carbide formed at the points of contact to progressively and selectively dissolve portions of the diamond surface with the liquid metal carbide until the diamond surface is reshaped to the desired configuration that is a reverse topography of the metal surface, and without applying substantial additional pressure to the diamond sufficient to cause the liquid metal carbide formed at the points of contact to be urged away from the points of contact to minimize undesired dissolution of the diamond surface.

21. The method of claim 20 and further comprising machining the metal surface to form the desired topography having a substantially reverse configuration of the desired configuration for the diamond surfaces.

22. The method of claim 20 and wherein the step of heating the metal surface further comprises heating the metal surface to a temperature above a melting temperature of the metal carbide formed by the diffusion of carbon atoms from the diamond into the metal surface to form the liquid metal carbide.

23. The method of claim 20 and wherein step (a) comprises orienting the metal surface in an upwardly facing configuration and placing the diamond on the metal surface, the weight of the diamond providing sufficient force to maintain the surface of the diamond in contact with the metal surface.

* * * * *

UNITED STATES PATENT AND TRADEMARK OFFICE
CERTIFICATE OF CORRECTION

PATENT NO. : 6,284,315 B1   Page 1 of 1
DATED : September 4, 2001
INVENTOR(S) : Tzeng It is certified that error appears in the above-identified patent and that said Letters Patent is hereby corrected as shown below:

Column 1,
Line 9, insert -- The U.S. Government has a paid-up license in this invention and the right in limited circumstances to require the patent owner to license others on reasonable terms as provided for by the terms of N68936-93-C-0246 awarded by Naval Air Warfare Center Weapons Division. --

Signed and Sealed this

Twelfth Day of March, 2002

Attest:

Attesting Officer

JAMES E. ROGAN
*Director of the United States Patent and Trademark Office*